United States Patent
Hsieh et al.

(10) Patent No.: US 9,570,692 B2
(45) Date of Patent: Feb. 14, 2017

(54) MOTHERBOARD OF FLEXIBLE DISPLAY PANEL AND METHOD FOR MANUFACTURING FLEXIBLE DISPLAY PANEL

(71) Applicant: BOE TECHNOLOGY GROUP CO., LTD., Beijing (CN)

(72) Inventors: Ming Che Hsieh, Beijing (CN); Chunyan Xie, Beijing (CN); Lu Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/762,061

(22) PCT Filed: Dec. 11, 2014

(86) PCT No.: PCT/CN2014/093608
§ 371 (c)(1),
(2) Date: Jul. 20, 2015

(87) PCT Pub. No.: WO2016/000418
PCT Pub. Date: Jan. 7, 2016

(65) Prior Publication Data
US 2016/0254464 A1    Sep. 1, 2016

(30) Foreign Application Priority Data
Jun. 30, 2014    (CN) .......................... 2014 1 0306919

(51) Int. Cl.
*B32B 3/10*    (2006.01)
*H01L 51/00*    (2006.01)
(Continued)

(52) U.S. Cl.
CPC ..... *H01L 51/0097* (2013.01); *G02F 1/133305* (2013.01); *H01L 51/003* (2013.01);
(Continued)

(58) Field of Classification Search
None
See application file for complete search history.

(56) References Cited

U.S. PATENT DOCUMENTS 7,964,250 B2 *   6/2011   Kim ....................... C23C 16/24
                                                           427/248.1
2009/0298211 A1  12/2009  Kim et al.
(Continued)

FOREIGN PATENT DOCUMENTS

CN    102013414 A    4/2011
CN    102890351 A    1/2013
(Continued)

OTHER PUBLICATIONS

International Search Report mailed Sep. 4, 2015; PCT/CN2014/093608.
(Continued)

*Primary Examiner* — Christopher Polley
(74) *Attorney, Agent, or Firm* — Ladas & Parry LLP

(57) ABSTRACT

A motherboard of flexible display panel and the method for manufacturing the flexible display panel are provided, the motherboard of flexible display panel includes a carrier substrate and at least one flexible display panel unit formed on the carrier substrate; the flexible display panel unit includes a liner layer, a flexible substrate and a display element; the liner layer includes a first zone and a second zone, the liner layer of the first zone has a laser absorptivity lower than that of the liner layer of the second zone, and the liner layer of the second zone has a critical energy no larger than that of the liner layer of the first zone; the first zone is located at the edge region of the flexible display panel unit.

20 Claims, 3 Drawing Sheets

(51) Int. Cl.
  *H01L 51/56* (2006.01)
  *G02F 1/1333* (2006.01)
(52) U.S. Cl.
  CPC ........ *H01L 51/56* (2013.01); *H01L 2251/301* (2013.01); *H01L 2251/303* (2013.01); *H01L 2251/308* (2013.01); *H01L 2251/5338* (2013.01); *Y10T 428/24777* (2015.01)

(56) References Cited

U.S. PATENT DOCUMENTS

| | | | |
|---|---|---|---|
| 2011/0059561 A1* | 3/2011 | Liao | H01L 27/1214 438/34 |
| 2011/0092006 A1* | 4/2011 | An | B29D 11/0073 438/29 |
| 2011/0147747 A1* | 6/2011 | Jeon | H01L 27/1248 257/59 |

FOREIGN PATENT DOCUMENTS

| | | |
|---|---|---|
| CN | 203503658 U | 3/2014 |
| CN | 104091535 A | 10/2014 |
| CN | 203931396 U | 11/2014 |
| JP | 2013-069769 A | 4/2013 |
| KR | 1020110111209 A | 10/2011 |

OTHER PUBLICATIONS

Written Opinion of the International Searching Authority mailed Apr. 9, 2015; PCT/CN2014/093608.

* cited by examiner

MOTHERBOARD OF FLEXIBLE DISPLAY PANEL AND METHOD FOR MANUFACTURING FLEXIBLE DISPLAY PANEL

TECHNICAL FIELD

At least one embodiment of the present invention relates to a motherboard of flexible display panel and a method for manufacturing the flexible display panel.

BACKGROUND

With the development of the techniques, the flexible display device has been widely used more and more. The flexible display device comprises an organic light-emitting diode display unit, an electrophoretic display device and the like. Due to the fact that the base substrate of the flexible display panel is a flexible substrate, it is difficult to form other display element thereon. The manufacture of a flexible display panel is primarily made in such a way that a carrier substrate (commonly a glass substrate) is taken as the carrier supporting the flexible substrate, then display element are formed on the flexible substrate, and finally, the flexible display panel and the glass substrate are separated from each other so as to obtain a flexible display panel.

SUMMARY

The embodiment of present invention provides a motherboard of flexible display panel and a method for manufacturing the flexible display panel, by forming the flexible display panel by using the motherboard of flexible display panel, it is possible to avoid fine dust produced due to laser removing from contaminating the surrounding processing atmosphere during the manufacturing process.

At least one embodiment of the present invention provides a motherboard of flexible display panel, comprising a carrier substrate and at least one flexible display panel unit formed on the carrier substrate, the flexible display panel unit comprises a liner layer, a flexible substrate and a display element formed on the carrier substrate, the liner layer of the flexible display panel unit comprises a first zone and a second zone, the liner layer of the first zone has a laser absorptivity lower than that of the liner layer of the second zone, and the liner layer of the second zone has a critical energy no larger than that of the liner layer of the first zone; the first zone is located at an edge region of the flexible display panel unit.

At least one embodiment of the present invention provides a method for manufacturing a flexible display panels, comprising: forming a liner layer of a flexible display panel unit on a carrier substrate, wherein the liner layer of the flexible display panel unit comprises a first zone and a second zone, the liner layer of the first zone has a laser absorptivity lower than that of the liner layer of the second zone, and the liner layer of the second zone has a critical energy no larger than that of the liner layer of the first zone; the first zone is located at an edge region of the flexible display panel unit; forming a flexible substrate on the liner layer; forming a display element on the flexible substrate; irradiating the liner layer by using laser; and separating the liner layer from the carrier substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMERALS

10—glass substrate; 11—liner layer; 12—flexible substrate; 13—display element; 111—first zone; 112—second zone.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
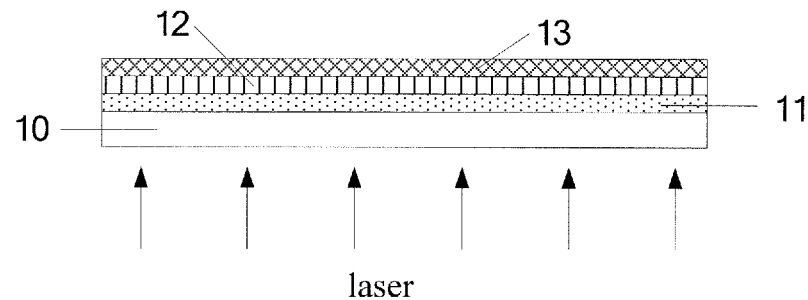
FIG. 1 is a schematic view illustrating removing of a liner layer and a carrier substrate by laser.

As illustrated in FIG. 1, a liner layer 11 is formed on a glass substrate 10, a flexible substrate 12 is formed on the liner layer 11, and then a display element 13 is formed on the flexible substrate 12, finally, the liner layer 11 is separated from the glass substrate 10, so as to obtain a flexible display panel comprising the liner layer.

As illustrated in FIG. 1, the laser is commonly used to irradiate through the glass substrate 10 from the bottom surface onto the liner layer 11, and is utilized to destroy the attaching interface between the liner layer and the glass substrate to reach the separation effect. However, under the irradiation of high temperature by laser, a portion of the bottom of the liner layer would fall off upon the separation of the glass substrate from the liner layer, the resultant fine dust may contaminate the surrounding process atmosphere.

Figure 2:
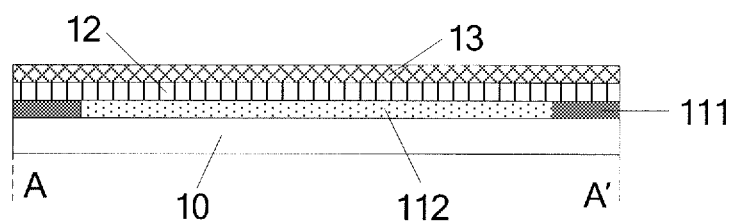
FIG. 2 is a schematic view in an A-A' direction of a motherboard of flexible display panel illustrated in FIG. 3.

At least one embodiment of the present invention provides a motherboard of flexible display panel, as illustrated in FIG. 2, which comprises: a carrier substrate (for example, the glass substrate 10 in FIG. 2) and at least one flexible display panel unit formed on the carrier substrate. The flexible display panel unit comprises a liner layer 11, a flexible substrate 12 and a display element 13 formed on the carrier substrate. The liner layer comprises a first zone 111 and a second zone 112, the liner layer of the first zone 111 has a laser absorptivity lower than that of the liner layer of the second zone 112, and the liner layer of the second zone 112 has a critical energy not larger than that of the liner layer of the first zone 111; the first zone 111 is located at an edge region of the flexible display panel unit.

It should be noted that, the manufacture of a flexible display panel is made primarily in such a way that the carrier substrate (generally, a glass substrate) is taken as the carrier supporting the flexible substrate, then display element are formed on the flexible substrate. To prevent damage to the flexible substrate, a liner layer is commonly formed on the carrier substrate in advance, and finally, the liner layer will be separated from the glass substrate so as to obtain a flexible display panel. In the embodiment of present invention, during the process of manufacturing a flexible display panel, the carrier substrate formed with a liner layer, a flexible substrate and a display element is the motherboard of flexible display panel of the embodiment of present invention. The flexible display panel could be obtained by separating the carrier substrate from the liner layer of the flexible display motherboard.

The critical energy of the liner layer is the laser intensity required for separating the liner layer from the carrier substrate. The greater the critical energy is, the higher the laser intensity required for separating the liner layer from the carrier substrate would be; and vice versa. Generally, the amorphous silicon, the silicon nitride and indium tin oxide (ITO) etc. are employed for the liner layer, and the liner layers being formed of amorphous silicon, silicon nitride and ITO have approximately equivalent critical energy. In the embodiment of present invention, the liner layer of the second zone has its critical energy not larger than that of the liner layer of the first zone, it is possible that the liner layer of the second zone has its critical energy less than that of the liner layer of the first zone; alternatively, the liner layer of the second zone has its critical energy equal to that of the liner layer of the first zone. It is preferable for the embodiment of present invention that the liner layer of the second zone has its critical energy less than that of the liner layer of the first zone.

For example, when the critical energy of the liner layer of the second zone is equal to that of the liner layer of the first zone, due to the fact that the liner layer of the first zone has a laser absorptivity less than that of the liner layer of the second zone, then under the same laser intensity, separation of the liner layer of the second zone from the carrier substrate is superior over separation of the liner layer of the first zone from the carrier substrate, that is, the liner layer of the first zone is kept attached to the carrier substrate while the liner layer of the second zone has been separated from the carrier substrate.

For example, when the critical energy of the liner layer of the second zone is less than that of the liner layer of the first zone, due to the fact that the liner layer of the first zone has a laser absorptivity less than that of the liner layer of the second zone, then under the same laser intensity, separation of the liner layer of the second zone from the carrier substrate is superior over separation of the liner layer of the first zone from the carrier substrate, that is, the liner layer of the first zone is kept attached to the carrier substrate while separation of liner layer of the second zone from the carrier substrate is further facilitated.

It should be noted that, some materials may have a laser absorptivity in inverse proportion to the critical energy, that is, the higher the laser absorptivity is, the lesser the critical energy would be. Thus in the embodiment of present invention, the liner layer of the first zone has a laser absorptivity less than that of the liner layer of the second zone, it is possible that the liner layer of the first zone has a critical energy larger than that of the liner layer of the second zone, that is, the liner layer of the second zone has a critical energy less than that of the liner layer of the first zone.

A motherboard of flexible display panel provided by the embodiment of present invention comprises a carrier substrate and at least one flexible display panel unit formed on the carrier substrate, FIG. 2 is a schematic view illustrating formation of one flexible display panel unit on the carrier substrate. For the purpose of mass production, it is also possible to form a plurality of flexible display panel units on one carrier substrate, wherein one flexible display panel unit will eventually become one flexible display panel, the procedures may be that, after the formation of a plurality of flexible display panel units, the plurality of display panel units are cut so as to obtain a plurality of flexible display panels.

In the embodiment of present invention, the liner layer of each of the flexible display units on the motherboard of flexible display panel comprises a first zone and a second zone, the liner layer of the first zone has a laser absorptivity less than that of the liner layer of the second zone, the liner layer of the second zone is readily to be separated from the carrier substrate while producing less fine dust, and the critical energy of the liner layer of the second zone is no larger than that of the liner layer of the first zone, then under the same laser intensity, the liner layer of the first zone is kept attached to the carrier substrate while the liner layer of the second zone being separated from the carrier substrate. Since the first zone is located at the edge region of the flexible display unit, thus when the liner layer of the second zone is separated from the carrier substrate, even if a portion of the liner layer of the second zone is broken off by the laser, the dropped fragment would not spread into surrounding environment, in this way, it is possible to avoid influence upon surrounding technology environment. Then, the portion of the flexible display panel corresponding to the first region and the portion of the flexible display panel corresponding to the second region may be disconnected from each other, alternatively, the portion of the flexible display panel and the carrier substrate corresponding to the first zone may be directly cut off. Then, the flexible display panel is absorbed in a mechanical manner, for example, by an adsorption device, and is separated from the carrier substrate.

It should be noted that, other processing atmosphere may be used for the following processes: the portion of the flexible display panel corresponding to the first region and the portion of the flexible display panel corresponding to the second region being disconnected from each other, alternatively, the portion of the flexible display panel and the carrier substrate corresponding to the first zone being directly cut off; and then the flexible display panel being absorbed in a mechanical manner, for example, by an adsorption device, and being separated from the carrier substrate. For example, after the flexible display panel is formed on the carrier substrate, laser irradiation is performed in a first workshop so that the liner layer of the second zone is separated from the carrier substrate; then in a second workshop, a portion of the flexible display panel and the carrier substrate corresponding to the first zone is cut off, and then the flexible display panel is adsorbed in a mechanical manner, for example, by using an adsorption device, to be separated from the carrier substrate. In this way, even if fine dust is produced when the liner layer of the second zone is separated from the carrier substrate, it is also possible to ensure a clean processing atmosphere at the first workshop.

In at least one embodiment, the materials for the liner layer comprises at least one selected from a group consisting of amorphous silicon, silicon nitride, silicon oxide, polyimide (PI) and indium tin oxide (ITO). Of course, the materials for the liner layer may also be other plastic materials, oxides or the like, the embodiment of present invention is described in detail merely by taking the above as examples.

In at least one embodiment, the liner layer of the first zone has a first material; the liner layer of the second zone has a second material, the first material has a laser absorptivity lower than that of the second material. The materials employed for the first zone and the second zone are different from each other, such that the different material properties are utilized to ensure that the laser absorptivity of the liner layer of the first zone is less than that of the liner layer of the second zone.

Of course, identical material may also be used to form the liner layer on the carrier substrate, but causing the liner layer of the first zone to have its laser absorptivity less than that of the liner layer of the second zone by different temperature and different surface parameters (for example, roughness of surface) of the liner layer.

In at least one embodiment, the first material is amorphous silicon, and the second material is silicon nitride. Experiment proves the relationships between the laser intensities required for being separated from the carrier substrate among the following materials, i.e., a-Si (amorphous silicon) >PI (polyimide plastic)>ITO (indium tin oxide)>$SiN_x$ (silicon nitride)=$SiO_x$ (silicon oxide). In the embodiment of present invention, the carrier substrate is preferably a glass substrate, the first material is amorphous silicon, and the second material is silicon nitride. Of course, the first and second materials may also be other substances; the embodiment of present invention is described in detail by merely taking the above as examples.

Figure 3:
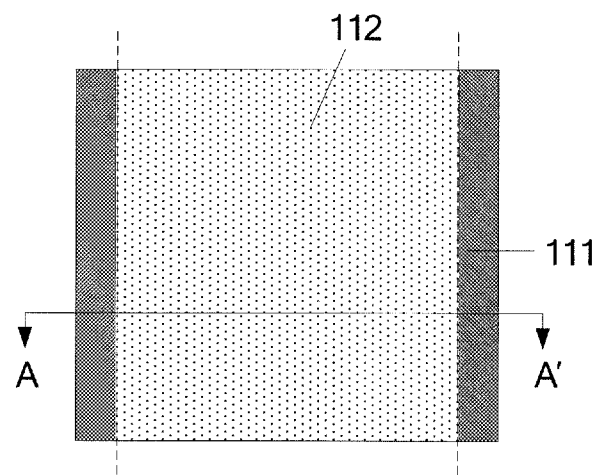
FIG. 3 is a schematic view illustrating a motherboard of flexible display panel provided by an embodiment of present invention.

In at least one embodiment, as illustrated in FIGS. 2 and 3, the first zone 111 is located at the edge region along two opposite sides of the flexible display panel unit. As illustrated in FIG. 3, the first zone 111 is provided at the edge region along two opposite sides of the flexible display panel unit, thus after formation of the display element of the flexible display panel unit, the flexible display panel may be obtained by disconnecting the first and second zones located at two opposite side edges of the flexible display panel unit (it may be that the first and second zones of the flexible display panel unit are cut off from each other along the dotted line illustrated in FIG. 3), or alternatively, by cutting off the edges at two opposite sides of the flexible display panel unit and the carrier substrate, i.e., the first zone, (the cutting may be performed along the dotted line illustrated in FIG. 3), and then separating the liner layer of the second zone from the carrier substrate in a mechanical manner (for example, adsorbing the flexible display panel by an adsorption device etc. to separating the flexible display panel from the carrier substrate), so as to obtain a flexible display panel.

Figure 4:
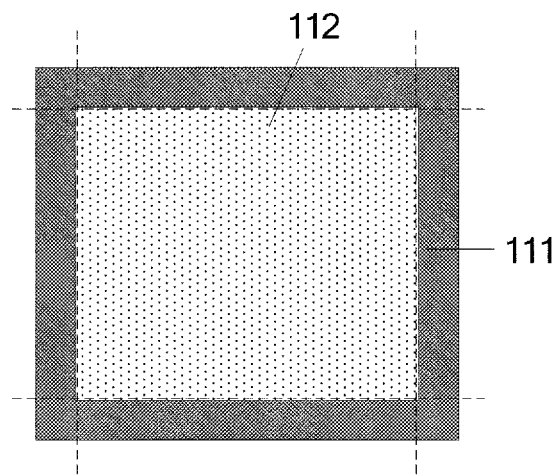
FIG. 4 is a schematic view illustrating another motherboard of flexible display panel provided by an embodiment of present invention.

In at least one embodiment, as illustrated in FIG. 4, the first zone 111 is located at the edge region along the circumference of the flexible display panel unit. After the display element of the flexible display panel unit have been formed, the flexible display panel may be obtained by disconnecting the first and second zones located at edged along the circumference of the flexible display panel unit (it may be that the first and second zones of the flexible display panel unit are cut away from each other along the dotted line illustrated in FIG. 4), or alternatively, by cutting off the portion of the flexible display panel unit and carrier substrate corresponding to the first zone (the cutting may be performed along the dotted line illustrated in FIG. 4), and then separating the liner layer of the second zone from the carrier substrate in a mechanical manner so as to obtain a flexible display panel.

Figure 5:
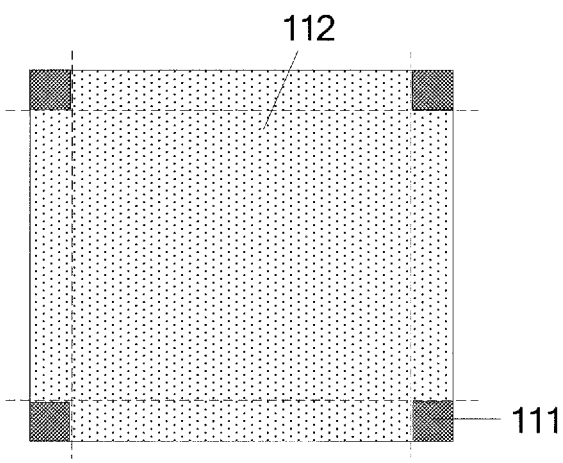
FIG. 5 is a schematic view illustrating another motherboard of flexible display panel provided by an embodiment of present invention.

Alternatively, in at least one embodiment, as illustrated in FIG. 5, the first zone 111 is located at four corner regions of the flexible display panel unit. The first zone is located at the four corners of the flexible display panel unit, the portions of the first zone corresponding to the first zone and the second zone may be disconnected from each other along the dotted line illustrated in FIG. 4, or alternatively, the portion of the flexible display panel unit and the carrier substrate corresponding to the first zone is cut off, and then the liner layer of the second zone is separated from the carrier substrate in a mechanical manner, so as to obtain a flexible display panel.

Figure 6:
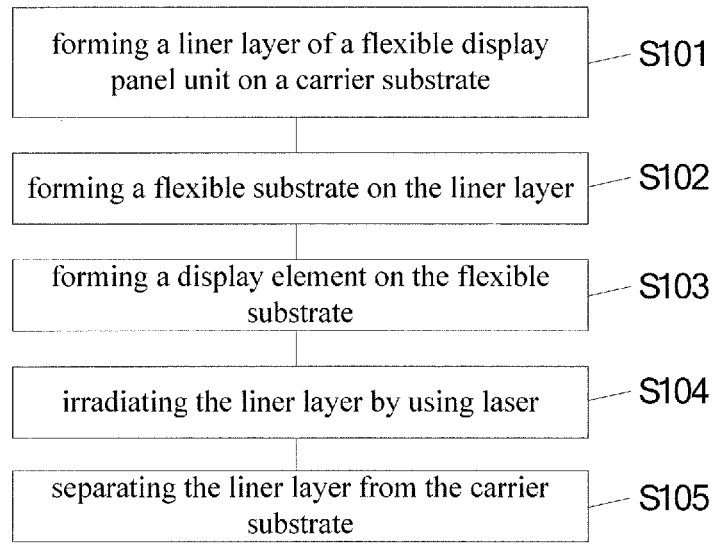
FIG. 6 is a schematic view illustrating a method for manufacturing a flexible display panel provided by an embodiment of present invention.

At least one embodiment of the present invention provides a method for manufacturing the flexible display panel, as illustrated in FIG. 6, the method comprises the following steps 101-105, which will be explained in detail as follows.

Step 101, a liner layer of a flexible display panel unit is formed on the carrier substrate.

The liner layer of the flexible display panel unit comprises a first and a second zones, the liner layer of the first zone has a laser absorptivity lower than that of the liner layer of the second zone, and the liner layer of the second zone has a critical energy not larger than that of the liner layer of the first zone; the first zone is located at the edge region of the flexible display panel unit.

In at least one embodiment, the material for the liner layer of the first zone comprises a first material; the material for the liner layer of the second zone comprises a second material, the first material has a laser absorptivity lower than that of the second material. In at least one embodiment, the first zone is located at the edge region along two opposite sides of the flexible display panel unit. Alternatively, the first zone is formed at the edge region along the circumference of the flexible display panel unit. Alternatively, the first zone is formed at four corner regions of the flexible display panel unit. In at least one embodiment, the liner layer is formed of the materials comprising at least one selected from a group consisting of amorphous silicon, silicon nitride, silicon oxide, polyimide and indium tin oxide. In at least one embodiment, the first material is amorphous silicon, and the second material is silicon nitride.

In at least one embodiment, the liner layer of the second zone has its critical energy less than that of the liner layer of the first zone. When the critical energy of the liner layer of the second zone is less than that of the liner layer of the first zone, and the liner layer of the first zone has a laser absorptivity less than that of the liner layer of the second zone, then under the same laser intensity, the separation of the liner layer of the second zone from the carrier substrate is superior over the separation of the liner layer of the first zone from the carrier substrate, that is, the liner layer of the first zone is kept attached to the carrier substrate upon the separation of liner layer of the second zone from the carrier substrate is further facilitated.

Step 102, a flexible substrate is formed on the liner layer.

Formation of the flexible substrate on the liner layer could be performed by using techniques know to the skilled in this art, no specific description will be repeated in the embodiment of present invention.

Step 103, a display element is formed on the flexible substrate.

Step 104, irradiating the liner layer by using laser.

For example, it is possible for the laser to irradiate the liner layer through the carrier substrate so as to destroy the attaching interface between the liner layer and the glass substrate. Due to the fact that the laser absorptivity of the liner layer of the first zone is less than that of the liner layer of the second zone, and the critical energy of the liner layer of the second zone is not larger than that of the liner layer of the first zone, then under the same laser intensity, the liner layer of the first zone is still kept attached to the carrier substrate upon the liner layer of the second zone having been disengaged from the carrier substrate. Due to the liner layer of the first zone attaches to the carrier substrate, when the liner layer of the second zone disengages from the carrier substrate, even fragments occur for the liner layer of the second zone by laser, they would not spread into the surrounding environment, thus it is possible to avoid influence on the surrounding technology atmosphere. In the embodiment of present invention, an example in which by laser radiation the liner layer of the second zone is separated from the carrier substrate while the liner layer of the first zone is attached with the carrier substrate is described.

Of course, it is possible that, under the same laser intensity, the liner layer is irradiated so that the bonding force of the liner layer of the first zone and the liner layer of the second zone with the carrier substrate is reduced, then a mechanical means is utilized to separate the liner layers from the carrier substrate.

Step 105, the liner layer is separated from the carrier substrate.

For example, a mechanical peeling off method may be employed. After the separation of the liner layer of the second zone from the carrier substrate, external force may be applied to separate it from the carrier substrate.

Figure 7:
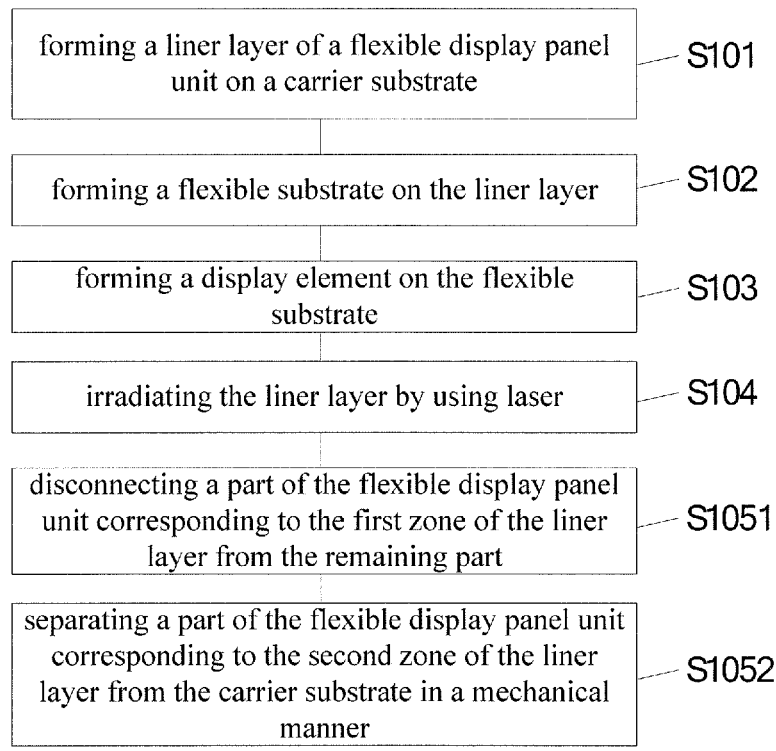
FIG. 7 is a schematic view illustrating another method for manufacturing a flexible display panel provided by an embodiment of present invention.

For example, as illustrated in FIG. 7, the separating of the liner layer from the carrier substrate may comprise the following steps 1051 and 1052.

Step 1051, a portion of the flexible display panel unit corresponding to the first zone of the liner layer is disconnected from the remaining portion.

The portion of the flexible display panel unit corresponding to the first zone of the liner layer may be as illustrated in FIGS. 3 and 4, and along the dotted line, the portion of the flexible display panel unit corresponding to the first zone is disconnected from the portion corresponding to the second zone; it is also possible, as illustrated in FIG. 5, to disconnect the portions of the flexible display panel unit corresponding to the first zone and the second zone (i.e., the portions of the first and second zones corresponding to each dotted line illustrated in FIG. 5) from the rest of the second portion (that is, the portion of the middle region defined by four dotted lines crossed with each other).

For example, disconnecting the portion of the flexible display panel unit corresponding to the first zone of the liner layer from the rest of the second portion may be performed by cutting off the portions of the flexible display panel unit and the carrier substrate corresponding to the first zone of the liner layer by using a cutter wheel, such that the portion of the flexible display panel unit corresponding to the first zone of the liner layer is disconnected from the rest of the second portion. It is also possible to cut off and disconnect the portion of only the flexible display panel unit corresponding to the first zone of the liner layer from the rest of portion corresponding to the second zone by using the cutter wheel. Thus, the carrier substrate is free from damage and could be further used for the manufacturing of other flexible display panels.

Step 1052, separating the portion of the flexible display panel unit corresponding to the second zone of the liner layer from the carrier substrate in a mechanical manner.

Under the same laser intensity, the liner layer of the first zone is kept attached to the carrier substrate upon the liner layer of the second zone having been disengaged from the carrier substrate, and it is possible to disconnect the first zone from the other second portions and then directly adsorb the portion corresponding to the flexible display panel by utilizing an adsorption device in a mechanical manner, so as to separate it from the carrier substrate. For example, a cutter wheel may be used to cut off the portion of the flexible display panel unit comprising the first zone so as to disconnect the portion of the flexible display panel corresponding to the first zone of the liner layer from the remaining portion, and then an adsorption device is employed to directly adsorb the portion corresponding to the flexible display panel, or the carrier substrate is directly taken away by force, so that the liner layer of the second zone is separated from the carrier substrate.

The above description is only an explainer embodiment of the present invention, rather than limiting the protective scope of the present invention, and the protective scope of the present invention is defined by the attached claims.

The present application claims the priority of the Chinese patent application No. 201410306919.3 filed on Jun. 30, 2014, the entirety of which is incorporated herein by reference as a part of the present application.

What is claimed is:

1. A motherboard of flexible display panel, comprising a carrier substrate and at least one flexible display panel unit formed on the carrier substrate, wherein,
   the flexible display panel unit comprises a liner layer, a flexible substrate and a display element,
   the liner layer of the flexible display panel unit comprises a first zone and a second zone, the liner layer of the first zone has a laser absorptivity lower than that of the liner layer of the second zone under the same laser intensity, and the liner layer of the second zone has a critical energy no larger than that of the liner layer of the first zone; the first zone is located at an edge region of the flexible display panel unit.

2. The motherboard of flexible display panel according to claim 1, wherein, a material of the liner layer comprises at least one selected from a group consisting of amorphous silicon, silicon nitride, silicon oxide, polyimide and indium tin oxide.

3. The motherboard of flexible display panel according to claim 1, wherein, the material for the liner layer of the first zone comprise a first material; the material for the liner layer of the second zone comprises a second material; the first material has a laser absorptivity lower than that of the second material.

4. The motherboard of flexible display panel according to claim 3, wherein, the first material is amorphous silicon, and the second material is silicon nitride.

5. The motherboard of flexible display panel according to claim 1, wherein, the liner layer of the second zone has a critical energy lower than that of the liner layer of the first zone.

6. The motherboard of flexible display panel according to claim 1, wherein, the first zone is located at the edge region at two opposite sides of the flexible display panel unit.

7. The motherboard of flexible display panel according to claim 1, wherein, the first zone is located at the edge region along a circumference of the flexible display panel unit.

8. The motherboard of flexible display panel according to claim 1, wherein, the first zone is located at four corner regions of the display panel unit.

9. The motherboard of flexible display panel according to claim 2, wherein, the material for the liner layer of the first zone comprise a first material; the material for the liner layer of the second zone comprises a second material; the first material has a laser absorptivity lower than that of the second material.

10. The motherboard of flexible display panel according to claim 2, wherein, the liner layer of the second zone has a critical energy lower than that of the finer layer of the first zone.

11. The motherboard of flexible display panel according to claim 2, wherein, the first zone is located at the edge region at two opposite sides of the flexible display panel unit.

12. A method for manufacturing a flexible display panels, comprising:
   forming a liner layer of a flexible display panel unit on a carrier substrate, wherein the liner layer of the flexible display panel unit comprises a first zone and a second zone, the liner layer of the first zone has a laser absorptivity lower than that of the liner layer of the second zone, and the liner layer of the second zone has a critical energy no larger than that of the liner layer of the first zone under the same laser intensity; the first zone is located at an edge region of the flexible display panel unit;
   forming a flexible substrate on the liner layer;
   forming a display element on the flexible substrate;
   irradiating the liner layer by using laser; and
   separating the liner layer from the carrier substrate.

13. The manufacturing method according to claim 12, wherein, a material of the liner layer comprises at least one selected from a group consisting of amorphous silicon, silicon nitride, silicon oxide, polyimide and indium tin oxide.

14. The manufacturing method according to claim 12, wherein, the material for the liner layer of the first zone comprise a first material; the material for the liner layer of the second zone comprises a second material; the first material has a laser absorptivity lower than that of the second material.

15. The manufacturing method according to claim 14, wherein, the first material is amorphous silicon, and the second material is silicon nitride.

16. The manufacturing method according to claim 12, wherein, the liner layer of the second zone has a critical energy lower than that of the liner layer of the first zone.

17. The manufacturing method according to claim 12, wherein, the first zone is located at the edge region at two opposite sides of the flexible display panel unit.

18. The manufacturing method according to claim 12, wherein, the first zone is located at the edge region along a circumference of the flexible display panel unit.

19. The manufacturing method according to claim 12, wherein, the first zone is located at four corner regions of the flexible display panel unit.

20. The manufacturing method according to claim 12, wherein, separating the liner layer from the carrier substrate comprises:
   disconnecting a part of the flexible display panel unit corresponding to the first zone of the liner layer from the remaining part, and a part of the flexible display panel unit corresponding to the second zone of the liner layer being separated from the carrier substrate in a mechanical manner.

* * * * *